United States Patent
Fujiwara

[19]

[11] Patent Number: 6,103,568
[45] Date of Patent: Aug. 15, 2000

[54] MANUFACTURING METHOD OF CYLINDRICAL STACKED ELECTRODE

[75] Inventor: Shuji Fujiwara, Tokyo, Japan

[73] Assignee: NEC Corporation, Tokyo, Japan

[21] Appl. No.: 09/276,734

[22] Filed: Mar. 26, 1999

[30] Foreign Application Priority Data

Mar. 27, 1998 [JP] Japan ................................ 10-081858

[51] Int. Cl.[7] ........................ H01L 21/8242; H01L 21/20
[52] U.S. Cl. ......................... 438/253; 438/396; 438/970
[58] Field of Search .................................. 438/253–256, 438/396–399, 970

[56] References Cited

U.S. PATENT DOCUMENTS

| | | | |
|---|---|---|---|
| 5,970,359 | 10/1999 | Wang | 438/396 |
| 6,030,866 | 2/2000 | Choi | 438/253 |
| 6,037,213 | 3/2000 | Shih et al. | 438/253 |

FOREIGN PATENT DOCUMENTS

8-204148  8/1996  Japan .
9-74174   3/1997  Japan .

*Primary Examiner*—Richard Booth
*Attorney, Agent, or Firm*—Foley & Lardner

[57] ABSTRACT

A method of manufacturing a cylindrical stacked electrode, which comprises the steps of forming a silicon film on a semiconductor substrate, forming an insulating film over said silicon film, etching said insulating film to open a first hole that reaches the semiconductor substrate lying beneath said silicon film, forming a second hole with a wider diameter than said first hole through said insulating film and, concurrently with that, opening a contact hole using said silicon film as a mask, burying said contact hole and, in addition, forming an amorphous silicon film into a shape of a cylindrical stacked electrode, forming a second insulating film on said amorphous silicon film to bury said second hole, etching said second insulating film to the level of the amorphous silicon surface, etching said amorphous silicon film to the level of the first insulating film surface, removing said insulating film, and removing a portion of the silicon film formed on the semiconductor substrate that is all but an area directly below said cylindrical stacked electrode.

6 Claims, 6 Drawing Sheets

MANUFACTURING METHOD OF CYLINDRICAL STACKED ELECTRODE

BACKGROUND OF THE INVENTION

1. Field of the Invention

The present invention relates to a manufacturing method of a semiconductor device and more particularly of a cylindrical stacked electrode.

2. Description of the Related Art

In a DRAM (Dynamic Random Access Memory) whose respective memory cells are constituted from one transistor and one capacitor, a higher degree of integration has been generally achieved by the miniaturization of memory cells. Accompanying the reduction of the memory cell area, however, an area that one capacitor can occupy has decreased such an extent that it has become difficult to provide the sufficient amount of storage charge Cs (25fF) to maintain a resistance against soft errors. At present, a storage electrode called the layered type (stacked type) is widely used in general, and a technique to enlarge the practical area of this electrode by forming, on the surface of the storage electrode, minute hemispherical crystalline grains of silicon, that is HSG-Si (Hemispherical Grained-Si), has come into use. Further, in addition to this HSG formation technique, another technique that uses a stacked capacitor having a three-dimensional cylindrical structure has been being applied in order to cope with high integration. Nevertheless, at the level of a 256M DRAM, an amount of storage charge Cs that can be obtained in a simple cylindrical capacitor or an HSG stacked capacitor is as little as 18 fF on calculation. Therefore, as the integration proceeds further from a 256M DRAM, it becomes necessary to use either a high dielectric layer such as $Ta_2O_3$ in place of $Si_3N_4$, or alternatively a capacitor structure combining a cylindrical type and an HSG type. The high dielectric layer is likely to be utilized in the future, but, in the present stage, is still on the way to development and difficult to put into practical use in semiconductor devices. Accordingly, a combined structure of a cylindrical type and an HSG type, each of which is proven to work, is the most promising as a stacked capacitor structure for a 256 M DRAM.

Furthermore, in the case of a simple cylindrical stacked electrode, a sidewall section in the forthcoming high integration semiconductor device will become very thin and the space between electrodes will become very narrow. Accordingly, there will arise a problem of its collapse during a wet step such as a cleaning after the formation of the cylindrical stacked electrode is completed. In the case that the HSG formation technique is applied to the conventional cylindrical stacked electrode, however, the sidewall section becomes even thinner and the problem of the sidewall collapse becomes more serious, since the HSG formation technique utilizes the silicon migration on the surface of a silicon layer. Therefore, how to heighten the mechanical strength of the sidewall section during the formation of the electrode becomes a crucial point.

Now, problems in manufacturing methods of conventional cylindrical stacked electrodes are described in detail. Referring to FIG. 2a to FIG. 2f, which are cross sectional views illustrating, in sequence, steps of the manufacturing method of a semiconductor device, a first conventional art is described.

Figure 2A:
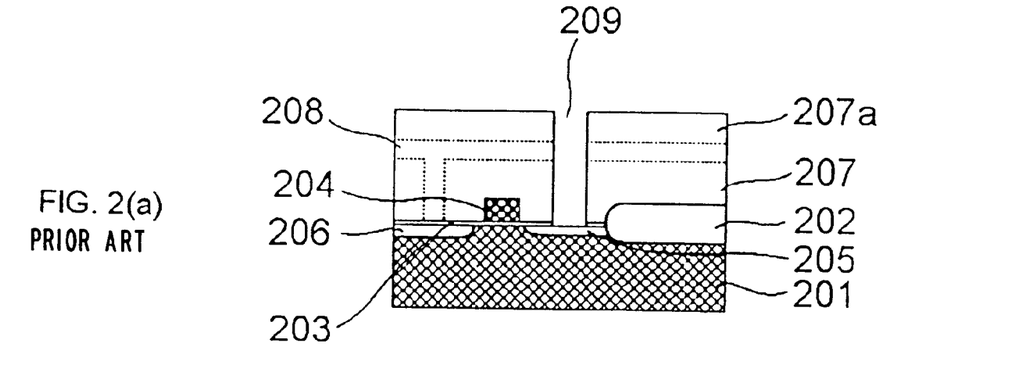

First, a field oxide film 202 is formed in an isolation region on the surface of a P-type silicon substrate 201, and a gate oxide film 203 is formed in the other region that is uncovered with the field oxide film on the silicon substrate. After a gate electrode 204 which also functions as a word line is formed on both the gate oxide film 203 and the field oxide film 202, N-type diffusion layers 205 and 206 which are to become source-drain regions are formed by the ion implantation method or the like. Next, an insulating film 207 of silicon oxide is deposited by the CVD (Chemical vapor Deposition) method and then a bit line 208 is formed. An interlayer insulating film 207a is deposited thereon, and thereafter, using a photoresist (not shown) as a mask, a contact hole 209 is made to expose a portion of the N-type diffusion layer 205 (FIG. 2a).

Figure 2B:
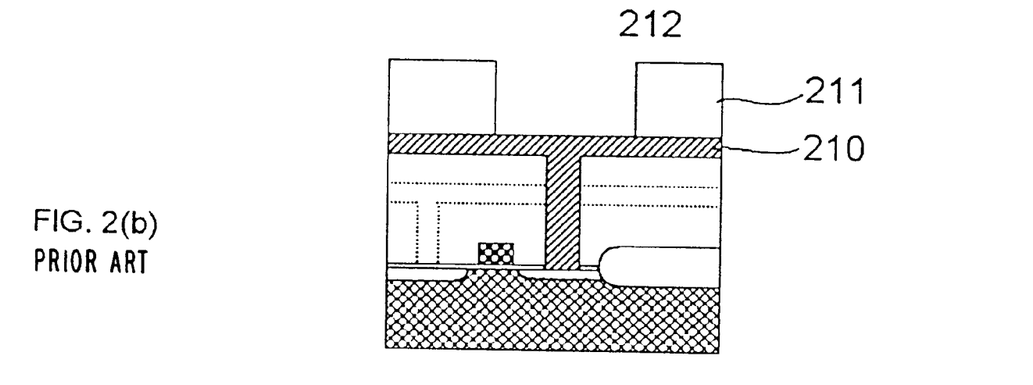

Next, a phosphorus-doped silicon film 210 is grown to a thickness of 150 nm or so, burying the contact hole 209. Further, a silicon oxide film NSG (Non-doped Silicate Glass) 211 is grown to a thickness of 700 nm or so, and thereafter, using a photoresist (not shown) as a mask, a hole 212 is made (FIG. 2b).

Figure 2C:
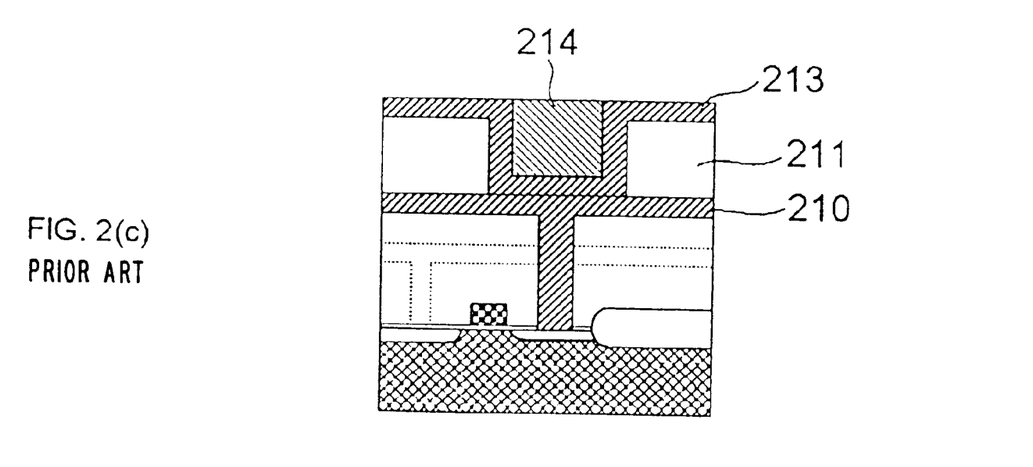

Next, a phosphorus-doped silicon film 213 is grown to a thickness of 100 nm or so, and then, using a photoresist 214, the hole 212 is buried in such a way that a gap section where a sidewall section of a cylindrical stacked electrode is to be formed is left open. Following this, a phosphorus-doped silicon film 213 is grown again and then, performing the dry etching-back, the phosphorus-doped silicon film 213 is exposed, as shown in FIG. 2c.

Figure 2D:
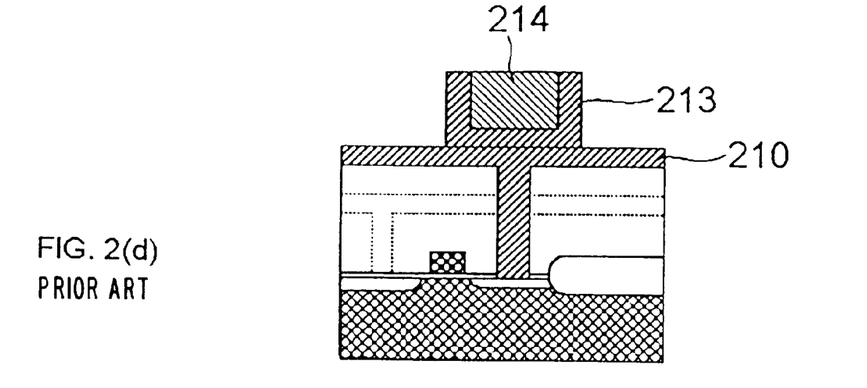

Next, the phosphorus-doped silicon film 213 is etched back by means of dry etching and the silicon oxide film NSG 211 is exposed. After this, the silicon oxide film 211 is removed with a HF (Hydrofluoric Acid) solution (FIG. 2d).

Figure 2E:
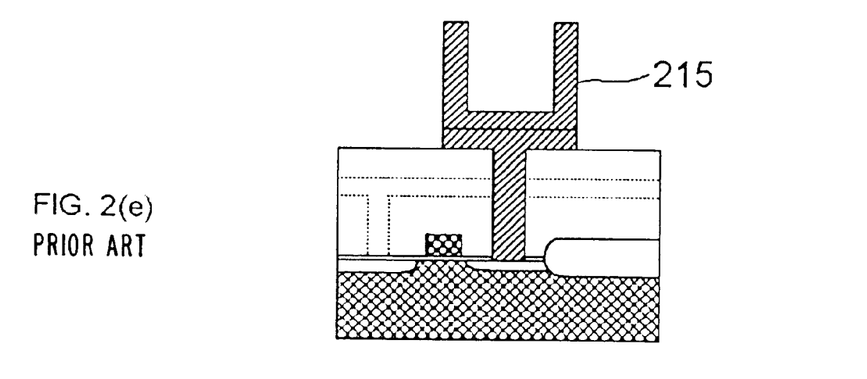
Figure 2F:
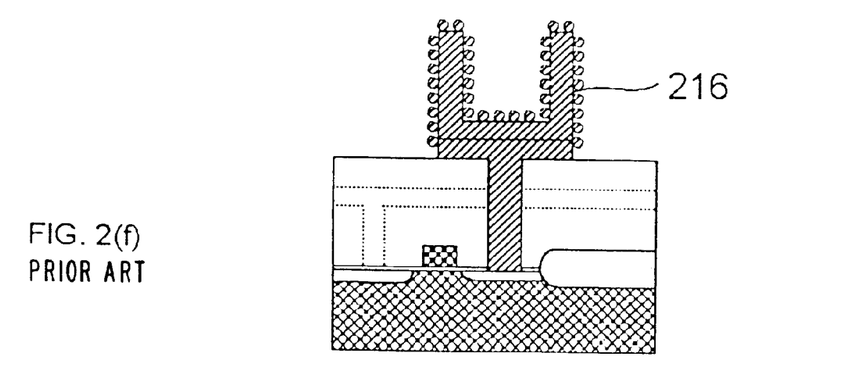

Next, a portion of the phosphorus-doped silicon film 210 that is all but an area directly below a cylindrical stacked electrode 215, is removed by means of dry etching-back, and finally the photoresist 214 is removed with SPM (Sulfuric acid-Hydrogen peroxide Mixture) solution, and thereby a cylindrical stacked electrode 215 is accomplished (FIG. 2e).

Further, referring to FIG. 3a to FIG. 3e, which are cross-sectional views illustrating, in sequence, steps of the manufacturing methods of a semiconductor device, a second conventional art is described. The reference numerals 301 to 308 in the drawings correspond to the numerals 201 to 208 in FIG. 2 shown above and a further description hereat is left out.

Figure 3A:
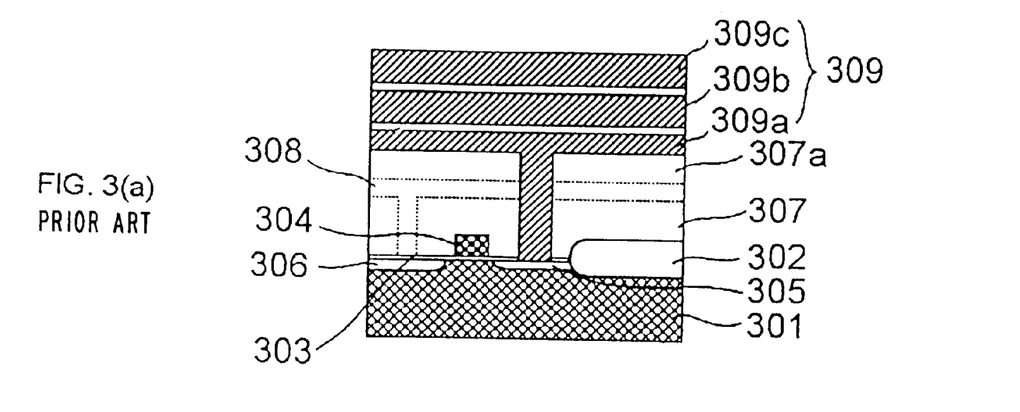
Figure 3B:
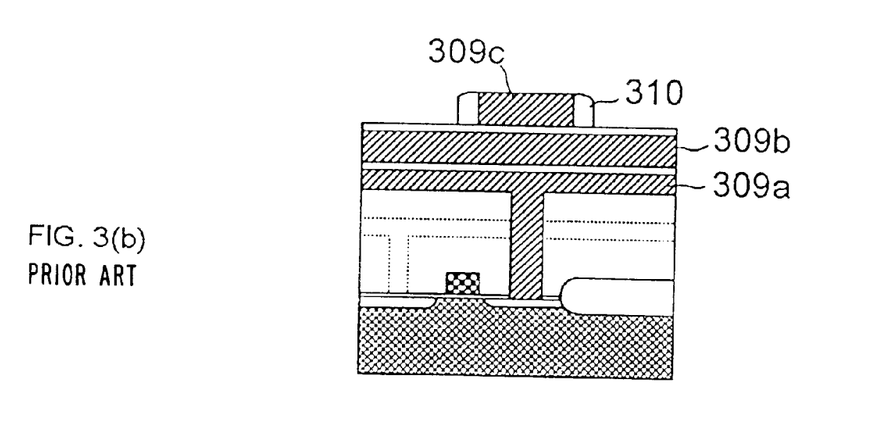

An interlayer insulating film 307a is deposited and then a contact hole is made, as described above, and thereafter a silicon film 309 is grown to a thickness of 1 $\mu$m or so. At this, the silicon film 309 has a layered structure in which a phosphorus-doped silicon film 309a with a thickness of 150 nm is first formed and thereon an $O_2$ leakage layer is stacked, and, further, another phosphorus-doped silicon film 309b with a thickness of 490 nm and thereon a second $O_2$ leakage layer and, further over those, a non-doped silicon film 309c with a thickness of 430 nm are stacked, in succession. The silicon films 309a to 309c are characterized by being successively grown in a furnace (FIG. 3a).

Figure 3C:
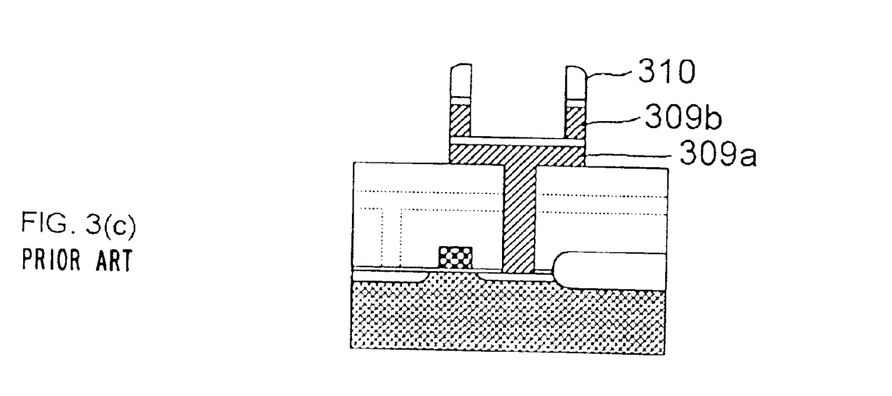
Figure 3D:
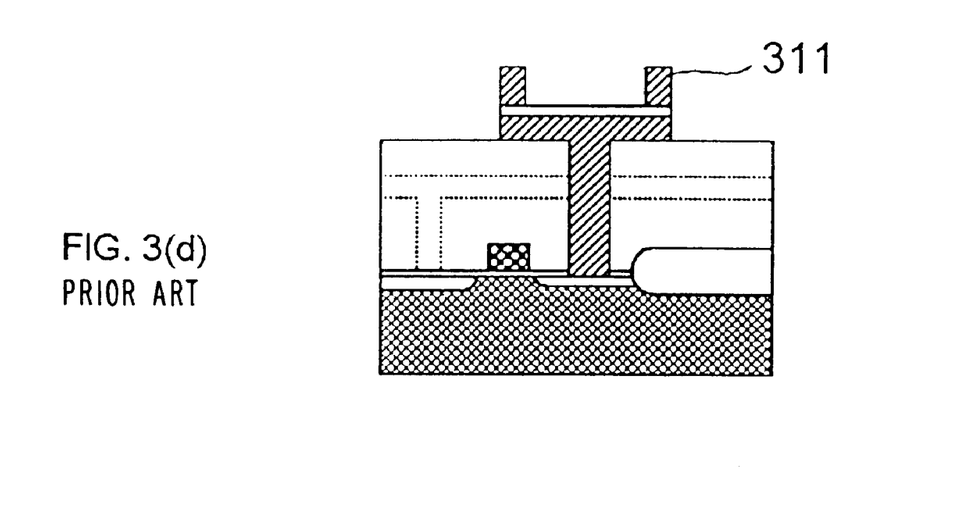

Next, using a photoresist (not shown) as a mask, the non-doped silicon film 309c within the layered phosphorus-doped silicon film 309 alone is etched. The $O_2$ leakage layer serves as a stopper layer for this etching. Further, after a silicon oxide film 310 is grown to a thickness of 250 nm or so, dry etch-back is carried out so as to leave a portion of the silicon oxide film 310 by the sidewall section of the non-doped silicon film 309c (FIG. 3b) Next, using the silicon oxide film 310 as a mask, the phosphorus-doped silicon film 309 is subjected to the dry etching. In this instance, with the $O_2$ leakage layer serving as a stopper layer, the bottom section of a cylindrical stacked electrode is prevented from reaching the interlayer insulating film (FIG. 3c). Next, the silicon oxide film 310 is removed with a HF solution, and thereby the formation of a cylindrical stacked electrode 311 is accomplished (FIG. 3d).

Figure 3E:
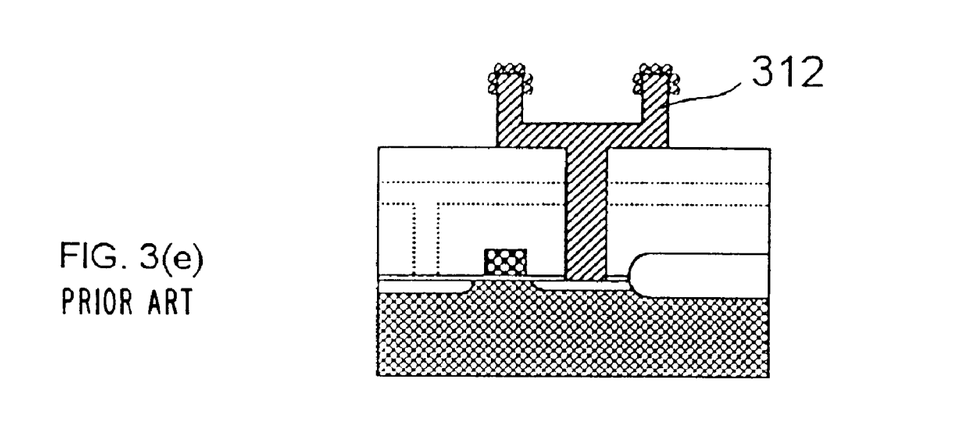

When the HSG formation technique is applied to the cylindrical stacked electrodes 215 and 311 which are manufactured according to the two conventional methods described above, HSG cylindrical combination-type stacked electrodes 216 and 312 are produced, respectively. Those electrodes each have their own shortcomings. First, in the electrode manufactured by the second conventional art, the formation of HSG-Si can be effected only in the upper section of the electrode, as shown in FIG. 3e. This results from a fact that the growth rate of phosphorus-doped silicon films is as low as several nm/min and, during a growth time thereof, which is consequently long, a gradual crystallization of silicon takes place. Moreover, the long growth time is a problem itself in respect of the manufacturing efficiency. Further, because the stopper used at the time of dry etching is the $O_2$ leakage layer and etch rates somewhat vary, the reproductivity of the electrode comes into question. Another problem is a possibility that an interlayer insulating film 307a is etched, in removing the silicon oxide film 310 used as the final mask.

Concerning the first conventional art, it is necessary to grow the phosphorus-doped silicon film 210, at least, to a thickness of 150 nm or so, in order to bury the contact hole 209 completely. Therefore, when this film 210 is finally removed by means of dry etch-back, the sidewall section of the electrode is made thin, due to a substantially long time taken to perform the dry etch-back, which lowers the mechanical strength of the electrode. Further, while the photoresist is utilized to protect the bottom section of the cylindrical electrode, in addition to the silicon film 210 formed in burying the first contact hole 209, another silicon film 213 is also formed as a film in the bottom section at the time of the sidewall section formation so that the films at the bottom of the electrode become thick. This causes another problem that a capacitance obtainable inside of the stacked capacitor in this art is relatively small for its height.

SUMMARY OF THE INVENTION

In light of the above problems, an object of the present invention is to provide a method of manufacturing a cylindrical stacked electrode, which, with the sidewall section being kept substantially thick, produces a cylindrical stacked electrode having ample mechanical strength and a sufficient amount of storage charge Cs and not affecting adversely the formation of HSG-Si thereon. The present inventor has successfully attained the above object and herein the present invention is disclosed. That is, the present invention relates to a method of manufacturing a cylindrical stacked electrode; which comprises the steps of forming a silicon film on a semiconductor substrate;
forming an insulating film over said silicon film;
etching said insulating film to open a first hole that reaches the semiconductor substrate lying beneath said silicon film;
opening a second hole with a wider diameter than said first hole through said insulating film and, concurrently with that, opening a contact hole using said silicon film as a mask;
burying said contact hole and, in addition, forming an amorphous silicon film into a shape of a cylindrical stacked electrode;
forming a second insulating film on said amorphous silicon film to bury said second hole;
etching said second insulating film to the level of the amorphous silicon surface;
etching said amorphous silicon film to the level of the first insulating film surface;
removing said insulating film; and
removing a portion of the silicon film formed on the semiconductor substrate that is all but an area directly below said cylindrical stacked electrode.

In accordance with an aspect of the present invention, there can be provided a cylindrical stacked electrode with ample mechanical strength. This effects an improvement in the production yield thereof as well as an increase in the amount of storage charge Cs. Further, during the manufacturing process of the electrode, the material of the electrode can be kept in the amorphous state without being crystallized so that a cylindrical stacked electrode produced is the most suitable to apply the HSG formation technique.

The above effects result from the use of the silicon film that can have a high selection ratio to silicon oxide films, in serving as a barrier layer for both dry and wet etchings. In consequence, the silicon film itself can be extremely thin. This enables to shorten the time required for its subsequent removal, which, in turn, reduces the amount of the sidewall of the stacked electrode shaven off thereat to a minimum. Consequently, the problem that the sidewall section may collapse during the subsequent cleaning period does not arise and, furthermore, the yield in production increases. As a matter of course, a loss in the amount of storage charge Cs due to the collapse of the sidewall section can be reduced.

In addition, if a phosphorus-doped silicon film is used as a silicon film and a film able to grow at a relatively low temperature, such as a plasma oxide film, is employed as a silicon oxide film that is to be grown in a later step, the crystallization does not take place in the electrode and, therefore, the cylindrical stacked electrode manufactured thereby is the most suitable to apply the HSG formation technique.

BRIEF DESCRIPTION OF THE DRAWINGS

FIG. 1a to FIG. 1f are cross-sectional views illustrating, in sequence, steps of a manufacturing method of a cylindrical stacked electrode in accordance with one embodiment of the present invention.

FIG. 2a to FIG. 2f are cross-sectional views illustrating, in sequence, steps of a manufacturing method of a semiconductor device in accordance with the first prior art.

FIG. 3a to FIG. 3e are cross-sectional views illustrating, in sequence, steps of a manufacturing method of a semiconductor device in accordance with the second prior art.

DETAILED DESCRIPTION OF THE PREFERRED EMBODIMENTS

Figure 1A:
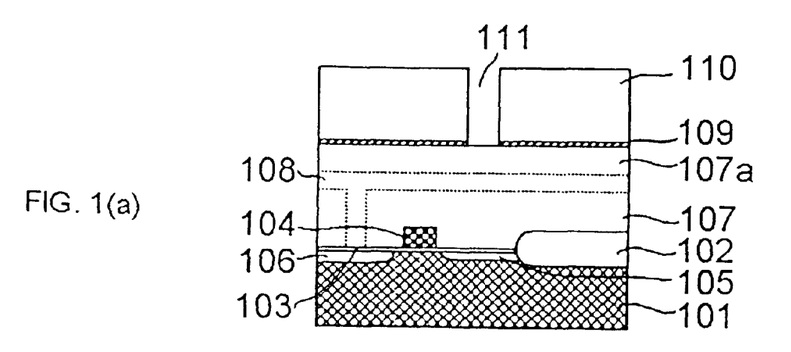

Referring to the drawings, a manufacturing method of the present invention is described in detail. FIG. 1a to FIG. 1f are cross-sectional views illustrating, in sequence, steps of a manufacturing method of a semiconductor device in accordance with one embodiment of the present invention. First, the composition of a semiconductor device in FIG. 1a is described. A field oxide film 102, a gate oxide film 103, a gate electrode 104, an N-type diffusion layers 105 and 106, interlayer insulating films 107 and 107a made of silicon oxide films and a bit line 108 are successively formed on a silicon substrate 101, and then amorphous silicon film 109 as well as a silicon oxide film 110 are grown thereon and a contact hole is opened therethrough.

Figure 1B:
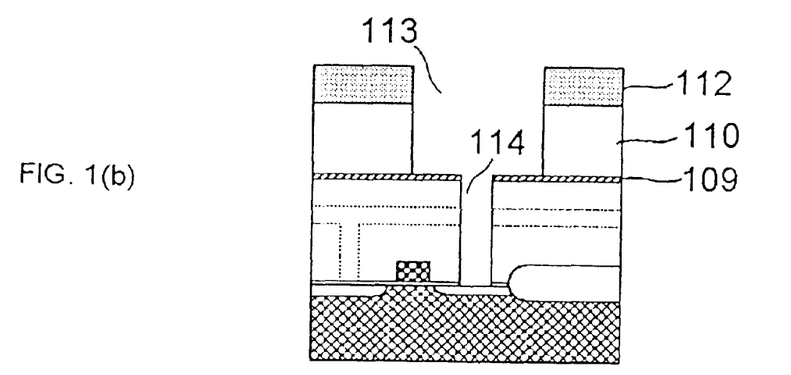
Figure 1C:
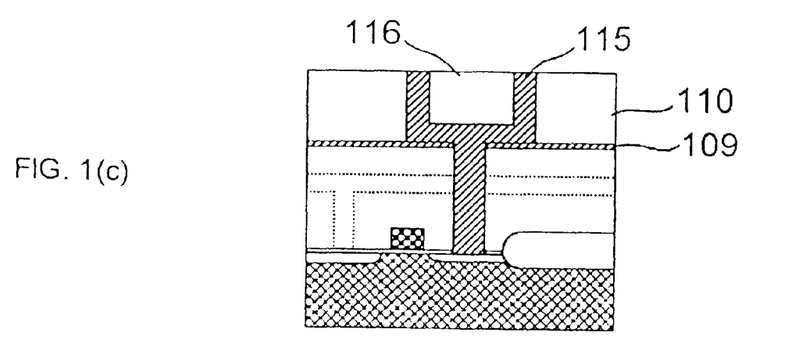

The drawings after FIG. 1b illustrate steps of forming a cylindrical stacked electrode. The amorphous silicon film 109 serves as an etching stopper film at the time of etching the oxide film by means of plasma etching as shown in FIG. 1b, and functions as a barrier layer for the interlayer insulating films at the time of etching the silicon oxide films 110 and 116 by means of wet etching as shown in FIG. 1c. By making a thickness of this amorphous silicon film 109 equal to or less than ⅓ of the thickness of the silicon film in the cylindrical stacked electrode, it is possible to maintain enough thickness in the bottom section of the cylindrical stacked electrode 115, even after a subsequent step of polysilicon plasma etching. Further, the time taken for that etching is short and, thus, this arrangement is characterized by its capability to heighten a mechanical strength thereof.

Figure 1D:
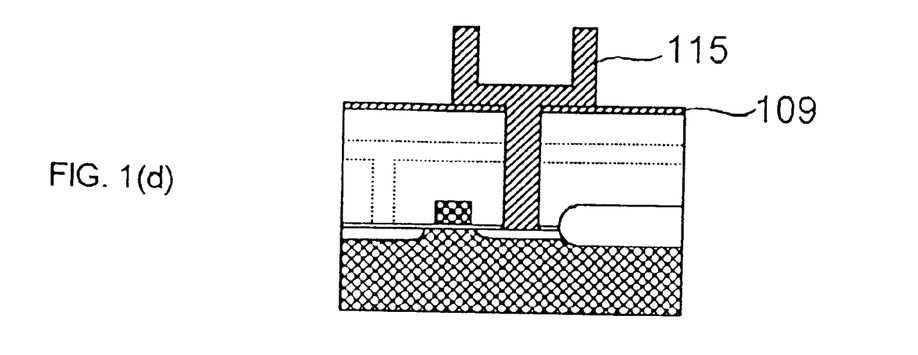
Figure 1E:
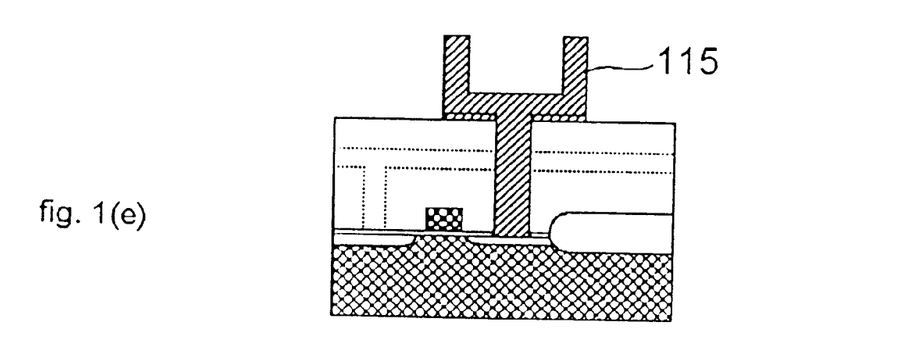

In the present invention, the amorphous silicon film 109 over the interlayer insulating film 107 is used as a stopper film, at the time of opening a contact hole 114 shown in FIG. 1b as well as at the time of removing the silicon oxide film 110 shown in FIG. 1d, and this amorphous silicon film 109 is finally removed by means of dry etching-back as shown in FIG. 1e. The use of the amorphous silicon film 109 having a high selection ratio to the silicon oxide film 110 as a stopper film hereat allows to make the amorphous silicon film itself extremely thin and, consequently, the amount of which the cylindrical section of the silicon film is etched can be reduced to a minimum.

Next, using an actual example, an embodiment of the present invention is described.

First embodiment

Referring to FIG. 1a to FIG. 1f which are cross-sectional views illustrating, in sequence, steps of a manufacturing method, the present embodiment is described.

First, a field oxide film 102 is formed in an isolation region on the surface of a P-type silicon substrate 101, and a gate oxide film 103 is formed in the other region which is uncovered with the field oxide film on the silicon substrate. After a gate electrode 104 which also functions as a word line is formed on the gate oxide film 103 and the field oxide film 102, N-type diffusion layers 105 and 106 which are to become source-drain regions are formed by the ion implantation method or the like. Next, an insulating film 107 of silicon oxide is deposited by the CVD method and then a bit line 108 is formed. An interlayer insulating film 107a is deposited thereon, and thereafter a silicon film 109 is deposited to a thickness of 30 nm or so. For the silicon film 109, any material among amorphous silicon, polysilicon, phosphorus-doped polysilicon and phosphorus-doped amorphous silicon can be used but, in view of controllability of the film thickness, phosphorus-doped amorphous silicon which has a low growth rate is the most suitable. While the silicon film 109 used herein serves subsequently as a stopper film at the time of opening a second hole 113 as well as at the time of removing silicon oxide films 110 and 116, its film thickness is determined solely by the condition at the time of opening a contact hole 114. The film thickness of interlayer insulating films 107 and 107a is approximately the same as the film thickness of the silicon oxide film 110 described below so that there is little difference between respective etching times. Therefore, if the film thickness is sufficient to cover the time for over-etching, no problem, at least, arises. It is possible to reduce the film thickness further (for example, to 10 nm or so) by regulating the amount of the interlayer insulating film etched during the next step of opening a first hole 111. Over these films, an insulating film made of a silicon oxide film such as an NSG (Non-doped Silicate Glass) 110, is further deposited to a thickness of 700 nm or so. After that, using a photoresist (not shown) as a mask, a hole 111 is made so as to expose the surface of the interlayer insulating film 107a which lies beneath the phosphorus-doped amorphous silicon film (FIG. 1a).

Next, using a photoresist 112 as a mask, the silicon oxide film NSG110 is etched and thereby a second hole 113 is made. Concurrently with this, formation of a contact hole 114 is carried out, using the silicon oxide film NSG 110 as well as the amorphous silicon film 109 as masks. At this, the phosphorus-doped amorphous silicon film 109 functions as an etching stopper layer for the silicon oxide film NSG 110. Nevertheless, even if the whole phosphorus-doped amorphous silicon film 109 is etched away, there offers no problem, as far as the interlayer insulating film 107a is left by the etching (FIG. 1b).

Next, a phosphorus-doped amorphous silicon film 115 which is to shape a bottom section and a sidewall section of a cylindrical stacked electrode (115) is formed, burying the contact hole 114 and continuing further to a thickness of 100 nm or so over the phosphorus-doped amorphous silicon film 109. Following this, a silicon oxide film, such as P-SiO$_2$ 116, is grown to a height of 50 nm or more in such a way that a gap section where the sidewall section of the cylindrical stacked electrode (115) is to be formed is left open, burying the second hole 113. In this gap section defined by the silicon oxide films NSG 110 and P-SiO$_2$ 116, a phosphorus-doped amorphous silicon film 115 is further grown to the substantially same height as that of P-SiO$_2$ 116. Next, the silicon oxide film P-SiO$_2$ 116 and the phosphorus-doped amorphous silicon film 115 are planarized by means of dry etch-back and the surface of the phosphorus-doped amorphous silicon film 115 is exposed (FIG. 1c).

Next, the silicon oxide films NSG 110 and P-SiO$_2$ 116 are removed with a HF solution or a HF atmosphere. In this instance, the phosphorus-doped amorphous silicon film 109 can function as a barrier layer for the interlayer insulating films 107 and 107a, having a very high selection ratio to both the silicon oxide films NSG 110 and P-SiO$_2$ 116. In particular, when a DHF solution (for example, HF : H$_2$O= 1:100) is used as the etchant, a selection ratio of 100 or more can be obtained so that the phosphorus-doped amorphous silicon film 109 is hardly etched (FIG. 1d).

Figure 1F:
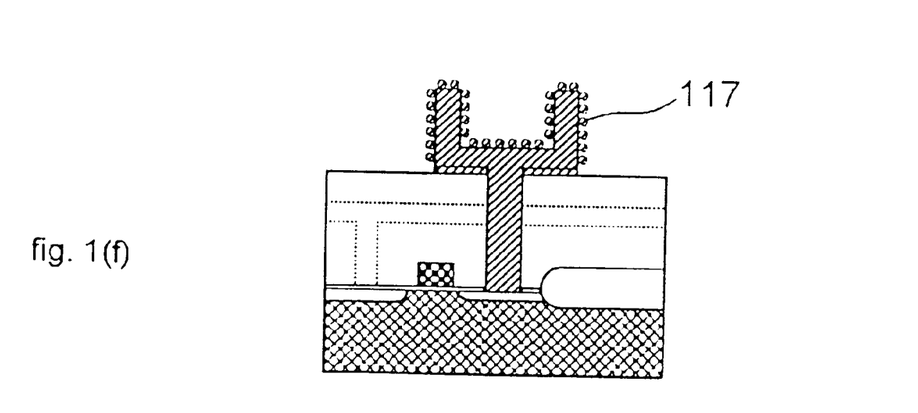

Next, a portion of the phosphorus-doped amorphous silicon film 109 that is all but an area directly below the cylindrical stacked electrode (115) is removed by means of dry etch-back. In this instance, because the thickness of the phosphorus-doped amorphous silicon film 109 is ⅓ of the film thickness of the cylindrical stacked electrode (115), even with 100% of the over-etch taken place, ⅔ of the initial film thickness of the cylindrical stacked electrode (115) is retained as the final thickness. This causes no problem in respect to the electrode (FIG. 1e). Hereupon the formation of the cylindrical stacked electrode (115) has been completed. With the electrode itself being securely kept in the amorphous state, an application of the HSG formation technique to the cylindrical stack finally accomplishes an HSG cylindrical combination-type electrode, as shown in FIG. 1f.

It should also noted that, even if a silicon film, such as an amorphous silicon film, a polysilicon film, a phosphorus-doped polysilicon film or the like, is used in place of the phosphorus-doped amorphous silicon film 109 which is employed in the first embodiment, the effects of the present invention can be obtained.

Further, in place of the silicon oxide film NSG 110 employed in the first embodiment, a silicon oxide film such as BPSG (Boro-phospho-silicate Glass), BSG (Boro-silicate Glass), PSG (Phospho-silicate Glass) or the like may be used with the very effects of the present invention.

Further, in place of the silicon oxide film P-SiO$_2$ 116 employed in the first embodiment, a silicon oxide film such as NSG, BPSG, BSG, PSG, P-SiON, P-SiOF, SOG (Spin-on Glass) or the like may be used with the very effects of the present invention.

Further, in place of the silicon oxide film P-SiO$_2$ 116 employed in the first embodiment, a photoresist film may be used with the very effects of the present invention. Further, although the dry etching-back method is employed for the planarization of both the silicon oxide film P-SiO$_2$ 116 and the phosphorus-doped amorphous silicon film 115 in the first embodiment, the CMP (Chemical Mechanical Polishing) method may be used instead, which provides the very effects of the present invention.

What is claimed is:

1. A method of manufacturing a cylindrical stacked electrode; which comprises the steps of:

forming a silicon film on a semiconductor substrate;

forming a first insulating film over said silicon film;

etching said first insulating film to open a first hole that reaches the semiconductor substrate lying beneath said silicon film;

forming a second hole with a wider diameter than said first hole through said first insulating film and, concurrently with that, opening a contact hole using said silicon film as a mask;

burying said contact hole and, in addition, forming an amorphous silicon film into a shape of a cylindrical stacked electrode;

forming a second insulating film on said amorphous silicon film to bury said second hole;

etching said second insulating film to the level of the amorphous silicon surface;

etching said amorphous silicon film to the level of the first insulating film surface;

removing said first and second insulating films; and removing a portion of the silicon film formed on the semiconductor substrate that includes all but an area directly below said cylindrical stacked electrode.

2. A method of manufacturing a cylindrical stacked electrode according to claim 1, wherein the film thickness of said silicon film formed on the semiconductor substrate is equal to or less than ⅓ of the film thickness of the amorphous silicon film formed into a shape of a cylindrical stacked electrode.

3. A method of manufacturing a cylindrical stacked electrode according to claim 1, wherein minute hemispherical silicon grains are formed on the surface of said cylindrical stacked electrode.

4. A method of manufacturing a cylindrical stacked electrode according to claim 1, wherein said silicon film formed on the semiconductor substrate is selected from a group consisting of a phosphorus-doped amorphous silicon film, a non-doped amorphous silicon film, a polysilicon film and a phosphorus-doped polysilicon film.

5. A method of manufacturing a cylindrical stacked electrode according to claim 1, wherein said second insulating film formed on said silicon film is selected from a group consisting of a non-doped silicon oxide film, a boron-doped silicon oxide film, a phosphorus-doped silicon oxide film and boron-phosphorus-doped silicon oxide film.

6. A method of manufacturing a cylindrical stacked electrode according to claim 1, wherein said second insulating film is a spin-on glass or a resist-coating film.

* * * * *